United States Patent
Kim

(10) Patent No.: US 7,619,390 B2
(45) Date of Patent: Nov. 17, 2009

(54) BATTERY CELL VOLTAGE AND IMPEDANCE MEASURING CIRCUIT

(75) Inventor: Deuk Soo Kim, Seoul (KR)

(73) Assignee: Powertron Eng'g Co., Ltd., Seoul (KR)

( * ) Notice: Subject to any disclaimer, the term of this patent is extended or adjusted under 35 U.S.C. 154(b) by 327 days.

(21) Appl. No.: 10/596,102

(22) PCT Filed: Dec. 4, 2004

(86) PCT No.: PCT/KR2004/003177

§ 371 (c)(1),
(2), (4) Date: May 30, 2006

(87) PCT Pub. No.: WO2005/054879

PCT Pub. Date: Jun. 16, 2005

(65) Prior Publication Data

US 2007/0090801 A1    Apr. 26, 2007

(30) Foreign Application Priority Data

Dec. 4, 2003    (KR) .................. 20-2003-0037800 U
Dec. 1, 2004    (KR) ...................... 10-2004-0099962

(51) Int. Cl.
*H02J 7/00* (2006.01)
(52) U.S. Cl. ..................... 320/134; 320/132; 320/137
(58) Field of Classification Search ............... 320/134, 320/132, 135, 136.137, 148
See application file for complete search history.

(56) References Cited

U.S. PATENT DOCUMENTS

| 5,708,348 A | * | 1/1998 | Frey et al. ................. 320/145 |
| 5,965,997 A | * | 10/1999 | Alwardi et al. ............. 320/132 |
| 6,294,896 B1 | * | 9/2001 | Champlin .................. 320/134 |
| 2002/0161537 A1 | * | 10/2002 | Odaohhara .................. 702/63 |

FOREIGN PATENT DOCUMENTS

| JP | 04-027885 | 1/1992 |
| JP | 07-128418 | 5/1995 |
| JP | 2000-088934 | 3/2000 |
| JP | 2004-251625 | 9/2004 |

* cited by examiner

*Primary Examiner*—Edward Tso
*Assistant Examiner*—Alexis Boateng
(74) *Attorney, Agent, or Firm*—Lowe Hauptman Ham & Berner, LLP

(57) ABSTRACT

In general, in the circuit to measure and diagnose the cell post voltage and internal impedance in storage battery cells and find out their aging status, the impedance voltage signal which is induced by the constant current is added to the direct current voltage on the storage battery cell post. This invention provides a much better method to discriminate the battery cell voltage 1.0 V-12 V and internal impedance voltage from the various noises on the battery cell post voltage like the induced ripple voltage, and then convert them to digital values by means of a A/D converter, and input the digital signals into a CPU. As a result, it raises the degree of accuracy in measurement of the internal impedance value of the battery.

10 Claims, 8 Drawing Sheets

[Fig. 1]
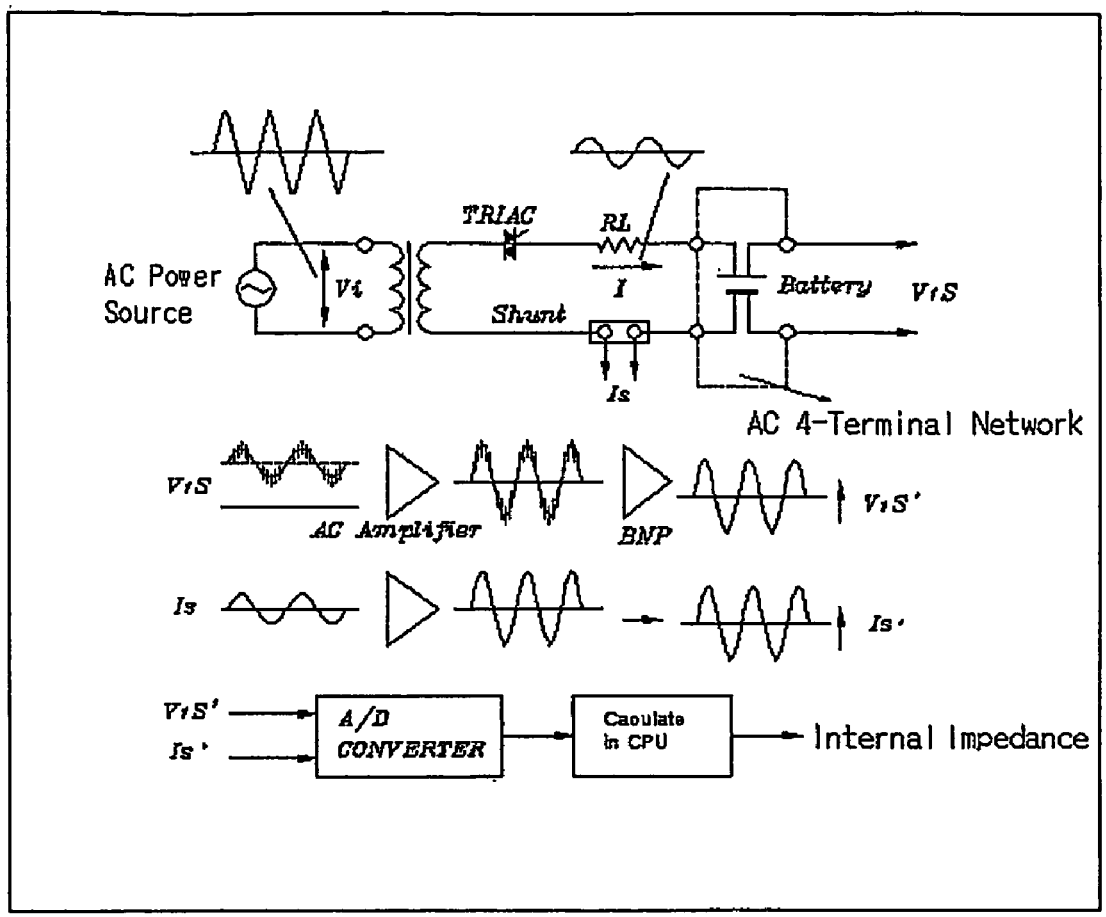

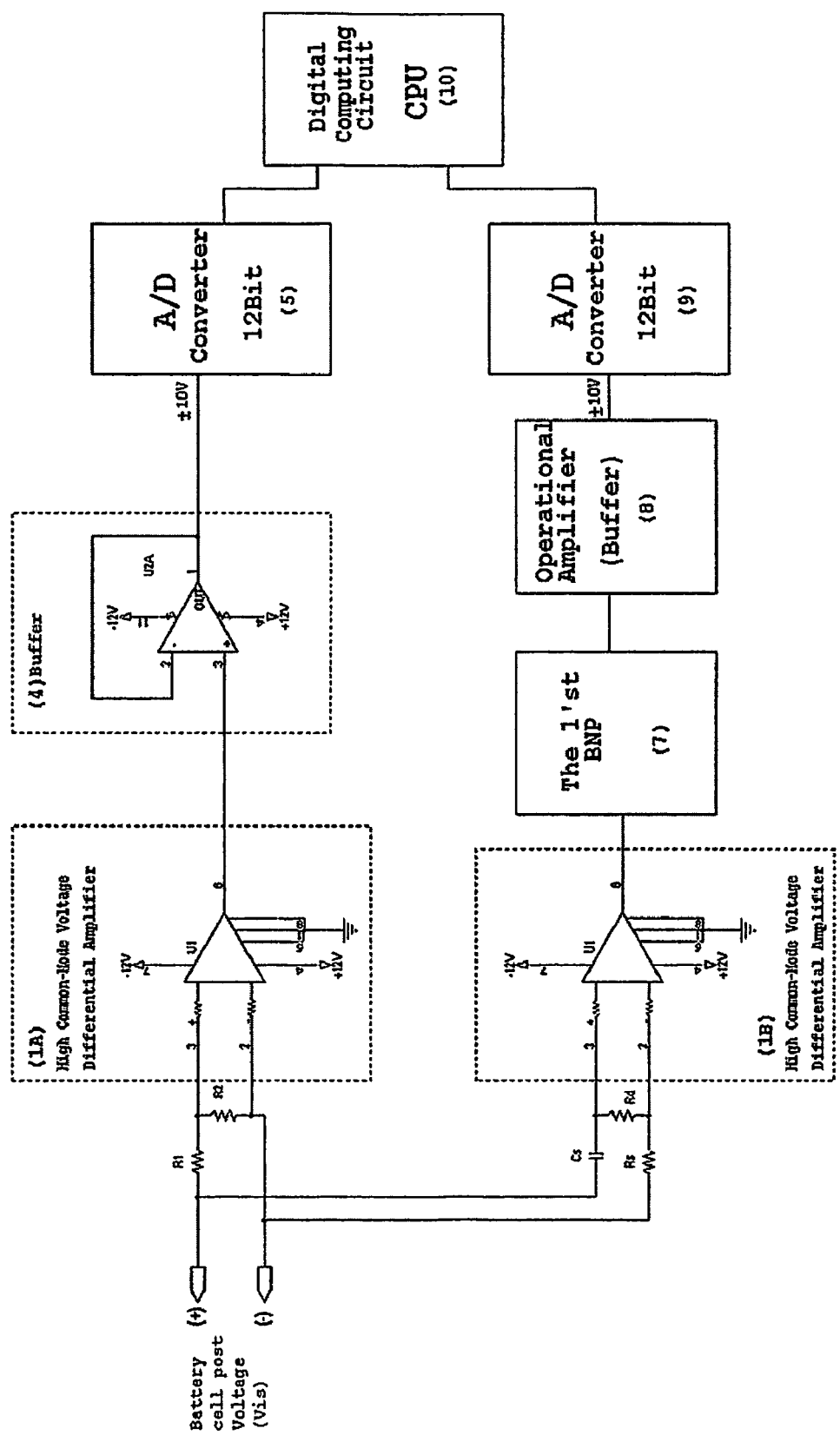
[Fig. 2]

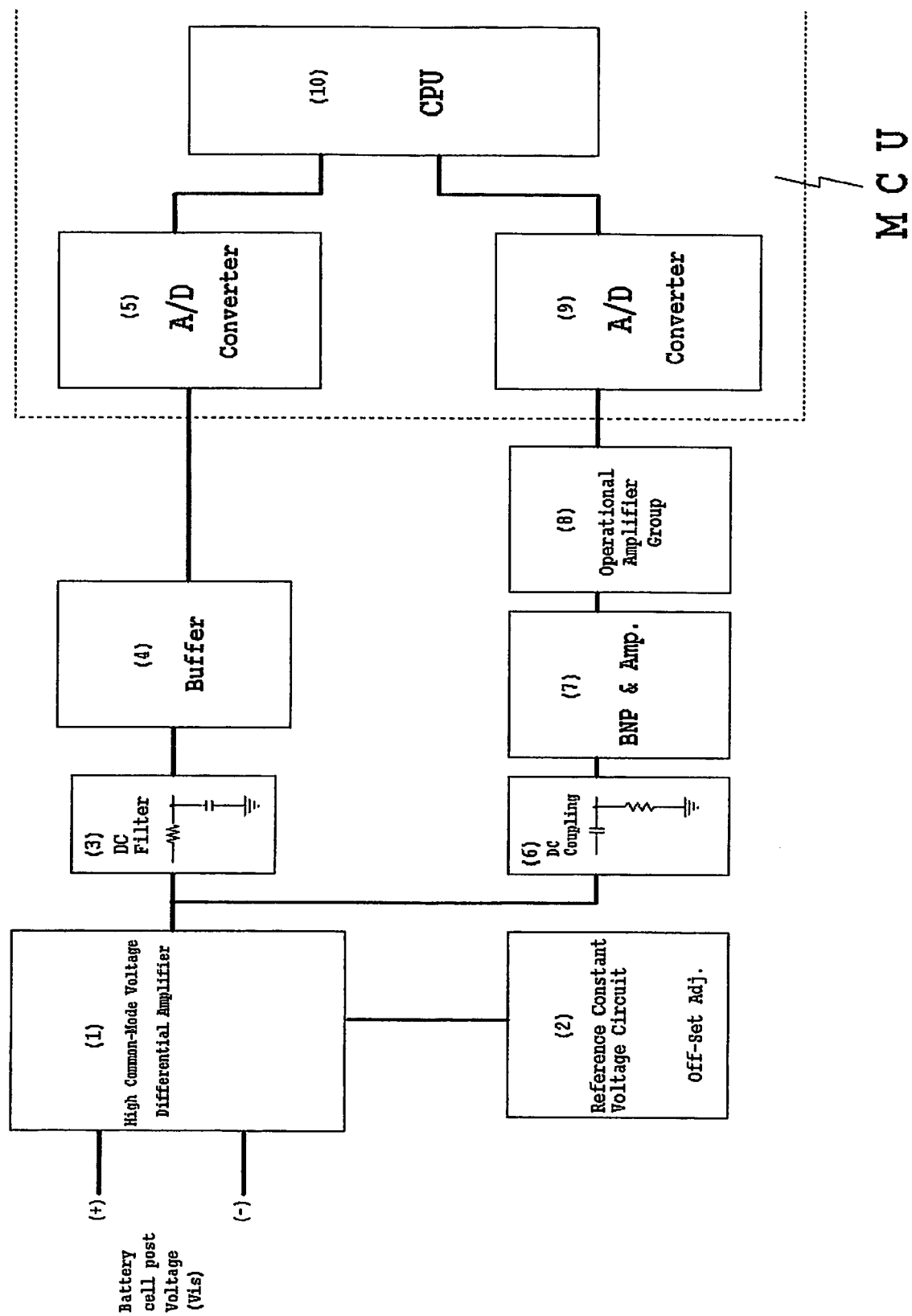
[Fig. 3]

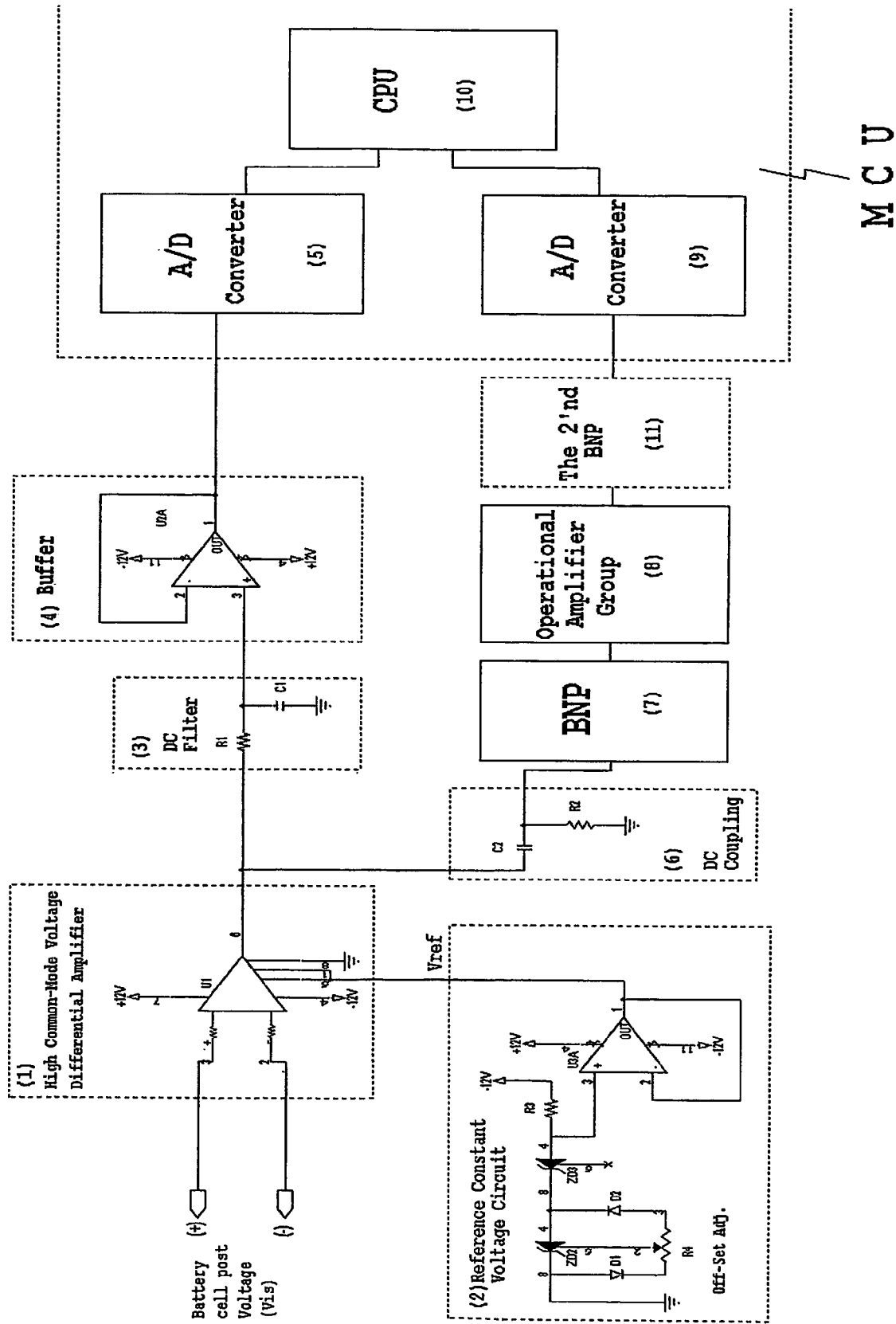
[Fig. 4]

[Fig. 5]
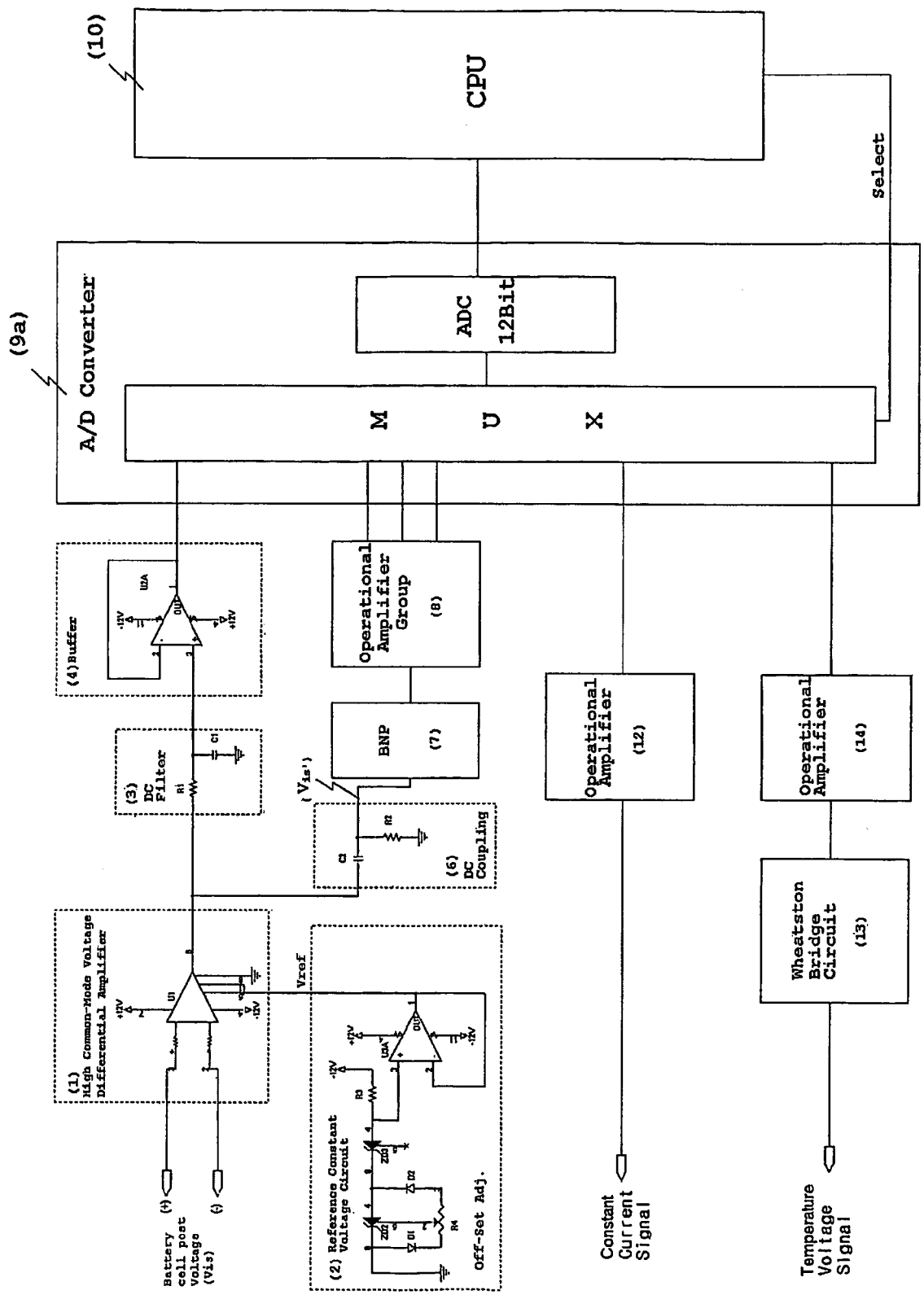

[Fig. 6]
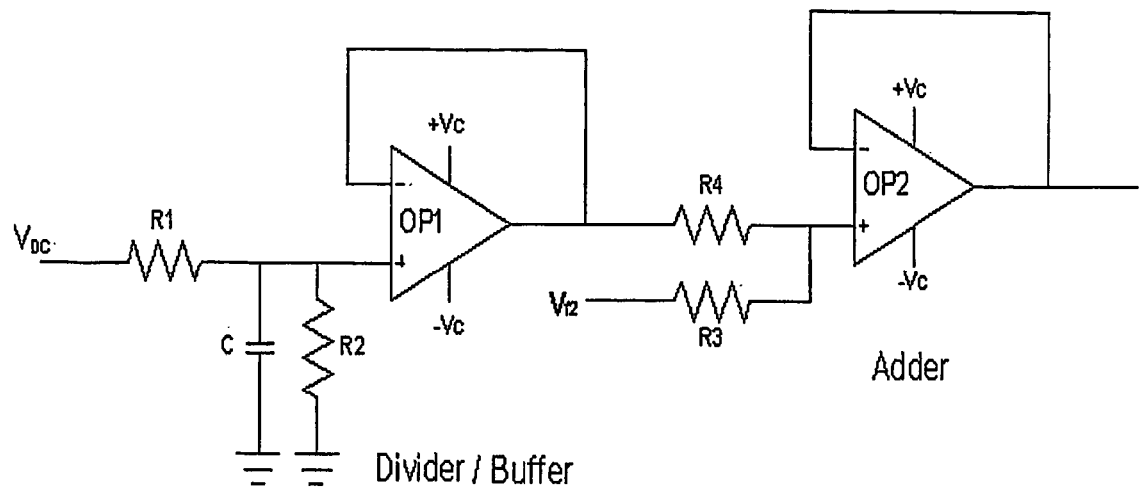
[Fig. 7]
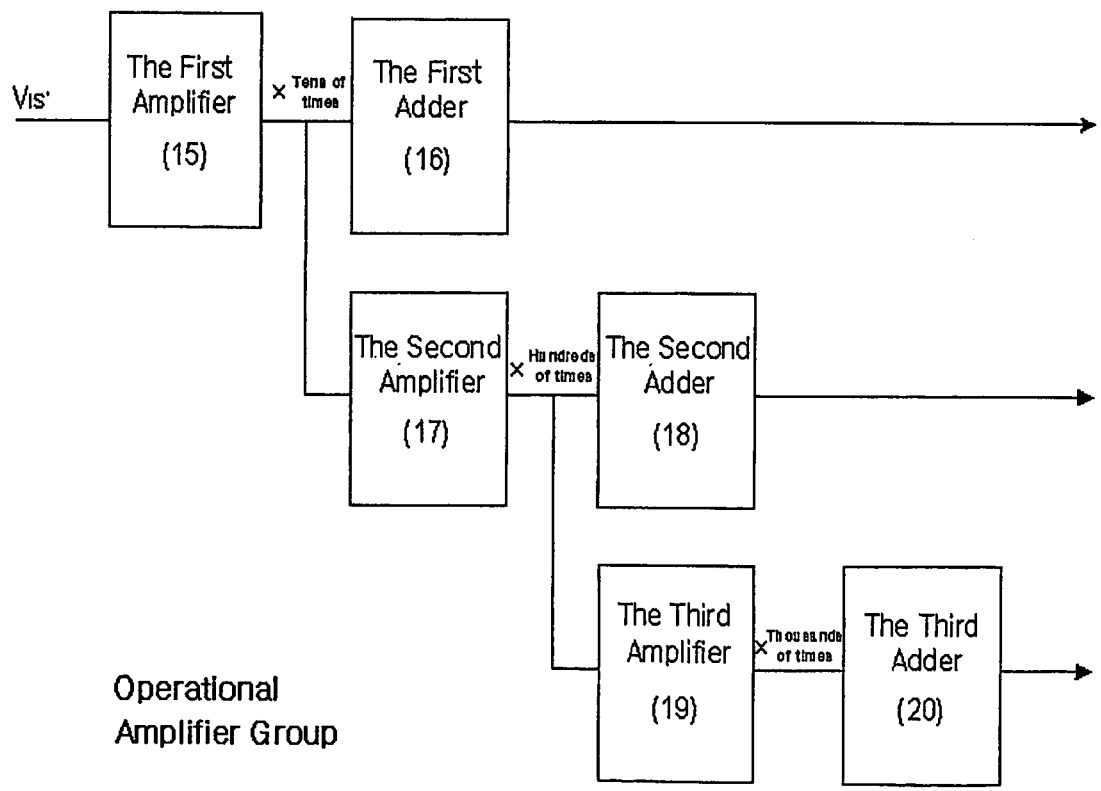

[Fig. 8]
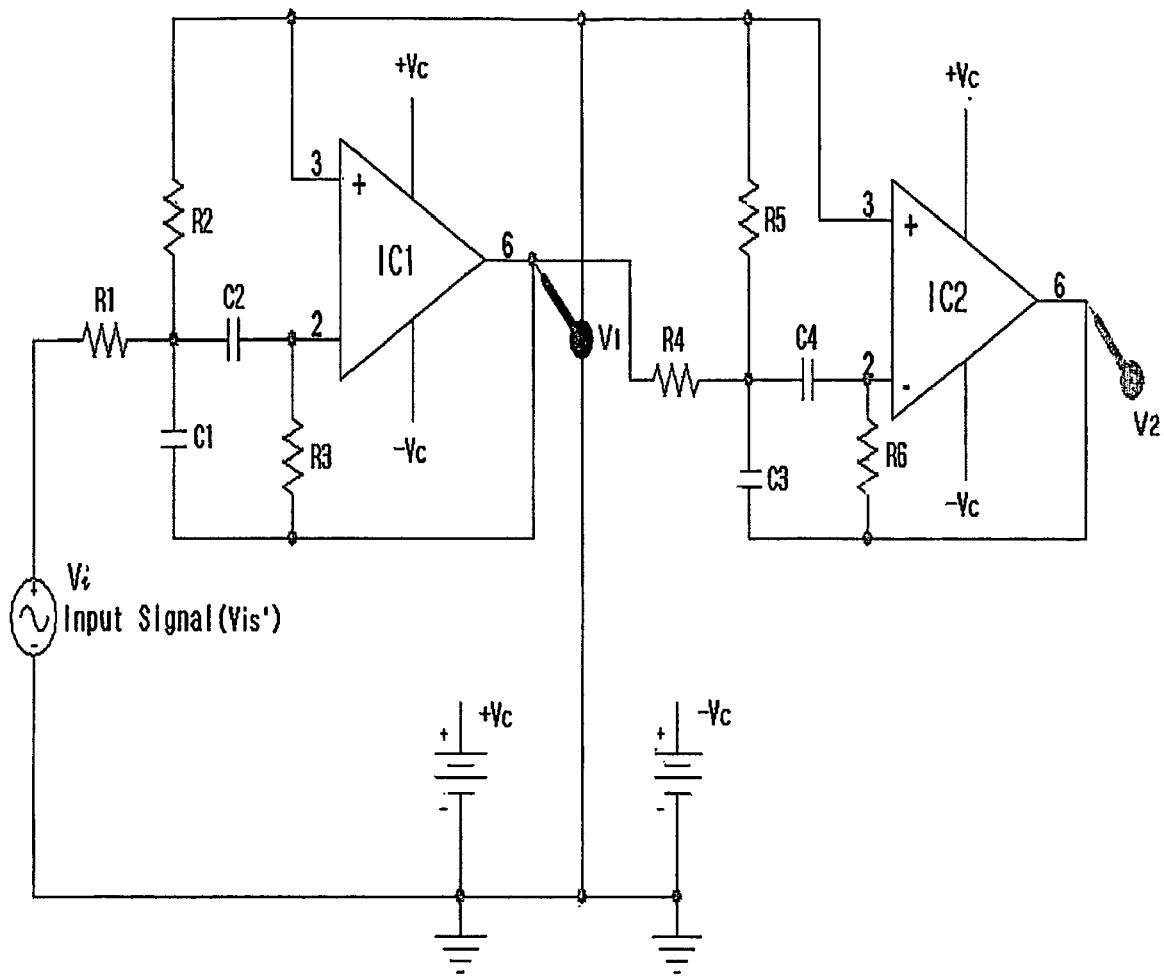

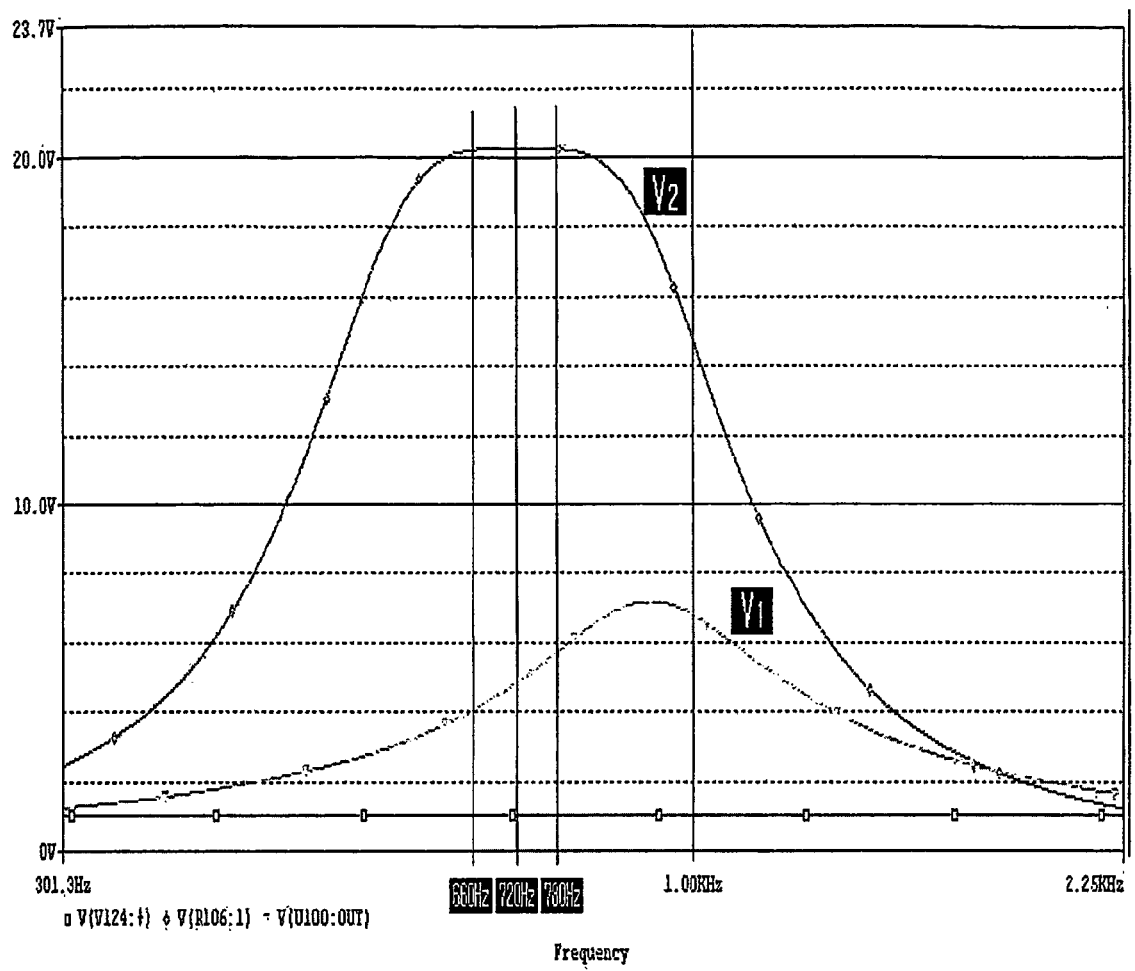
[Fig. 9]

BATTERY CELL VOLTAGE AND IMPEDANCE MEASURING CIRCUIT

TECHNICAL FIELD

Because storage batteries for stationary application are used a lot in emergency power facility or communication network power facility, it is very important to maintain these batteries effectively. The instrument and diagnostic systems to measure the cell voltage and internal impedance as a method of diagnosis their aging (status of healthiness) are being commercialized. In order to understand the aging status of the object such as storage battery, in which the internal impedance increases according to the aging degree, the method of inputting alternating constant current $I_s$ into the both terminals of the object such as storage battery, thereby measuring ($V_{Is}'$) (hereinafter referred to as impedance voltage) which is the voltage induced by impedance to measure the internal impedance and thus diagnosing the status of healthiness is common.

As illustrated in FIG. 1, the size of the internal impedance of storage battery is very small, so the alternating 4-terminal network method is used so as to minimize the effect such as the resistance of the measuring lead wire or the contact resistance of the plug. The internal impedance ($V_{Is}'$) which is generated between the both end terminals by the above constant current $I_s$ is measured by Sense terminal by means of imputing the alternating constant current $I_s$ into the both end terminals of the object such as storage battery through Source terminal in the constant current source circuit.

BACKGROUND ART

The size of internal impedance in batteries, in the case of large capacity batteries, is very small at 1 mΩ or less. Likewise, the voltage ($V_{Is'}$) generated by internal impedance in battery cells is a small signal of a number of mV. The voltage is very small (one-some thousandths) compared with the cell post voltage of 1.0-15V, and it's mixed with much electromagnetic wave noise from the surrounding area. Therefore, there is a need to appropriately separate this signal from a battery cell voltage ($V_{DC}$), remove the noise from the signal by means of an optimized design of the noise removal circuit like the disclosed band-pass filter aimed at amplifying the signal appropriately, and input accurate, high resolution impedance voltage signals into the A/D converter unit in the main processor unit (MPU).

Also, there are protective fuse contact resistance, connected line resistance and parasitic impedance components in the four-terminal network circuit that connects the above signals to the input of the measuring circuit, and there is likewise a parasitic impedance value within the measuring circuit as well. Thus, in case of measuring the voltage generated by internal impedance in batteries, because the internal impedance value is a very low signal, there is a need to work out the methods which are designed to eliminate effects of parasitic impedance such as voltage drop value due to the contact resistance in the 4-terminal network and measuring circuit, and the resistance in the cabling line.

The method presented here uses one high common mode voltage differential amplifier not only to enlarge the measuring range of the battery cell voltage and to enhance the resolution for precise measurement but also to couple the impedance voltage contained in the direct current components of the battery cell voltage with the coupling condenser, and then filters the noise through the band-pass filter, and makes the signal precise and high in resolution, and converts the signal into a digital signal by means of A/D converter, and computes it to obtain the value of impedance.

BRIEF DESCRIPTIONS OF THE DRAWINGS

FIG. 1 is a concept configuration for measuring a storage battery cell voltage and internal impedance FIG. 2 is a conventional circuit for measuring a storage battery cell voltage and internal impedance FIG. 3 is a block diagram of the storage battery cell voltage and internal impedance voltage of this invention FIG. 4 is the circuit configuration of an example of embodiment of this invention FIG. 5 is the circuit configuration of another example of embodiment of this invention FIG. 6 is the divider/buffer and adder circuit of an example of embodiment of this invention FIG. 7 is the detailed circuit of the operational amplifier group of this invention FIG. 8 is the band-pass filter circuit of this invention FIG. 9 is the attenuation property curve of the band-pass filter of this invention

TECHNICAL PROBLEM

This invention is related to a circuit which provides a method to measure the battery cell voltage ($V_{DC}$) and the internal impedance of a storage battery cell by transforming the signal voltage ($V_{Is}$) which contains the small alternating current (AC) impedance voltage signal generated by the internal resistance of the storage battery cell, which is inputted through 4-terminal network circuit, to a proper level and making the Microprocessor unit (CPU) compute it. Also, this invention especially maximizes the impedance between the storage battery cell and the measuring circuit by means of High Input Common Mode Voltage differential amplifier to give the effect of isolating the both circuits. This invention comprises a band-pass filter, A/D converter and CPU circuit in a way to accurately calculate the internal impedance by measuring the impedance voltage ($V_{Is}'$) by the internal impedance of a storage battery cell and the direct current (DC) voltage ($Vd_{dc}$) of a storage battery cell as well.

However, as illustrated in FIG. 2, conventionally, voltage divider circuit Resistance R1 and R2 in the differential amplifier (1A) input terminal were used to measure the cell voltage of 1.0.about.15V, wherein the storage battery cell post voltage ($V_{Is}$) was divided by about half, reduced to 0.5.about.7.5V level, and inputted to the above differential amplifier (1A). Sequentially, the output signal of the above differential amplifier (1A) passes through the Buffer circuit, is converted into a digital value in the A/D converter, and inputted into the CPU to compute the battery cell voltage ($V_{DC}$). Also as the impedance voltage ($V_{Is}'$) generated by the internal resistance of a storage battery cell is a very small signal, the circuit in the following way is used to measure it. The voltage signal ($V_{Is}$) of the storage battery cell is not divided to be measured. The direct current components in the above voltage signal ($V_{Is}$) are directly coupled through the direct current coupling circuit comprised of Resistance Rs and Rd and Capacitor Cs to obtain only impedance voltage signal ($V_{Is}'$) and this signal is inputted into another separate differential amplifier (1B) to have its noise removed by means of a band-pass filter circuit and a buffer circuit, and then this signal is inputted into the A/D converter inside the micro controller (MCU).

But in case the direct current voltage of a storage battery cell and the impedance voltage ($V_{Is}'$) by the internal resistance of the storage battery cell are divided by Divider Resistance R1 and R2 and connected to the differential amplifier (1A) as done in the conventional method, the direct current voltage ($V_{dc}$) of the battery cell voltage ($V_{Is}$) has much noise induced by Voltage Divider Resistance R1 and R2. Because of this, when measured in the micro-controller (MCU), the precision in the measurement is dropped. And in case the length of the measuring cable (4-terminal network) is long, a closed circuit is comprised between the storage battery cell and Divider Resistor R1 and R2, and the above Divider Resistor R1 and R2 are loaded along the measuring cable and then electric current flows. When measuring the cell voltage, the voltage drop occurs due to the resistance in cable line and measuring errors generate, therefore it is not possible to get accurate values in the measurement.

In addition, a direct current coupling circuit, comprised of Capacitor Cs and Resistance Rs and Rd are used in the input terminal of the differential amplifier (1B) to obtain the impedance voltage signal ($V_{Is}'$) of alternating current, wherein the electric current of the storage battery cell flows through the Condenser Cs connected serially with the storage battery cell and Discharge Resistance Rd passing through the measuring cable, resulting in the more drops of voltage by the resistance in the cabling line, making it impossible to get accurate measurement values by the conventional or existing method.

TECHNICAL SOLUTION

This invention solves these problems. To solve these problems, this invention does not use the voltage divider circuit and the direct current coupling circuit, in the input circuits of the differential amplifier (1) to apply the battery voltage signal ($V_{Is}$) of the storage battery cell which includes impedance voltage ($V_{Is}'$) to the input terminal circuit of the micro-controller (MCU), but connects the cell voltage ($V_{Is}$) of 0~16V which includes impedance voltage ($V_{Is}'$) directly to the input terminal of the above differential amplifier (1), and properly divides the direct current voltage ($V_{dc}$) of the battery cell and the impedance voltage signal and provides an optimized band-pass filter to remove the noise. In addition, this invention uses a proper A/D converter circuit and its peripheral circuits to produce desired resolution. This simple and concise method ensures more accuracy in measurement.

ADVANTAGEOUS EFFECT

This invention transforms the signals to the maximum level allowed in the micro-controller unit (MCU) even when the cell post voltage is within 1~21V by applying the constant voltage of a suitable negative (−) level to the offset terminal of the High Input Common Mode Voltage differential amplifier, thereby raising the degree of resolution to over 12 Bits and makes it possible to measure small impedance voltage signals ($V_{Is}'$) accurately by putting a direct current coupling circuit behind the output terminal of the differential amplifier (1), so that the input impedance of the measuring circuit from the 4-terminal network output stage can be maximized to reduce the measuring errors by the established impedance.

In particular, if a high input common mode voltage differential amplifier is used, it has an effect that the input and output circuits are insulated from each other since the high resistors about hundreds of kΩ are connected to non-inverting and inverting input circuits of the differential amplifier. Further, another embodiment teaches a scheme to realize the function of amplifier by adopting an A/D converter built in a micro controller unit (MCU).

Also this invention makes it possible not only to accurately measure the storage battery cell voltage ($V_{DC}$) and impedance voltage ($V_{Is}'$) by using one high input common mode voltage differential amplifier without being affected from the measuring circuit but also to couple the impedance voltage added to the direct current components of the battery cell voltage by means of a condenser and thus to produce precise and high resolution signals by A/D converter fitting to the purpose. This can effectively exclude the effect of the noise signal in the computation by means of properly designed band-pass filter (BNP) and thus it is possible to get the true value of the impedance voltage ($V_{Is}$). As another example of embodiment, this invention presents a proper method to use the A/D converter built in the micro-controller unit (MCU) in order to realize the function.

THE BEST MODE FOR THE EXECUTION OF THIS INVENTION

Further, only the true value of impedance voltage can be effectively obtained by excluding the effect raised by ripple noise signals during measuring computation process from the internal impedance voltage signals by properly designed band-pass filter (BNP).

Through the below FIG. 3, FIG. 4 and FIG. 5, the process of operation is illustrated in detail. FIG. 3 and FIG. 4 show that the direct current voltage ($V_{DC}$) of the storage battery cell and the impedance voltage signal ($V_{Is}'$) by the internal resistance of the storage battery cell is not voltage-divided and directly connected to the input terminal of the above differential amplifier (1). And they illustrate in detail the circuit for the input of a certain negative (−) constant voltage in the offset terminal of the above differential amplifier (1) so as to obtain the output signal accurately related to the input signal.

As an example of the execution of this invention, the negative (−) constant voltage (−8V in the example of embodiment of this invention) generated by the disclosed reference constant voltage circuit (2) is inputted (connected to) into the Offset terminal of an high input common mode voltage differential amplifier, wherein a negative (−) constant voltage, −8V, is generated by two reference constant voltage Diodes whose price is relatively inexpensive and whose drift value is small. The reference constant voltage circuit (2) comprises Constant voltage Diode ZD2 and ZD3 and Current limiting Resistor R3 in a series connection. The back terminal of the above Resistor R3 and the cathode (−) of the above Constant voltage Diode ZD2 are connected to −12V and the grounded point of a control power source respectively. The negative constant voltage generated here is connected to the offset terminal of Differential Amplifier (1) through a buffer circuit. Also on the both terminals of the above Constant voltage Diode ZD2, Diode D1, Variable Resistor R4 and Diode D2 are connected in series to be voltage-divided, and the central terminal of Variable Resistor R4 is connected to the ADJ terminal of Constant voltage Diode ZD2 in a way that adjusts the output voltage of constant voltage Diode ZD2 by the above variable resistor R4 so as to minutely adjust the output of the reference constant voltage circuit.

The output voltage of the constant voltage Diode (reference diode) used in the above circuit does not change less than that of Zener Diode even if the surrounding temperature and power source voltage (−12V) are varied, so its characteristic is very good. It is possible to compensate the offset output which can be generated due to the characteristic difference between circuit components inside the measuring circuits, by adopting the circuits comprised as above and adjusting the reference value of the offset voltage approximately within −7.8V~−8.3V with Variable Resistor R4.

In general, the output of an operational amplifier, regardless of the size of the input signal, is saturated to the values according to the size of the power source voltage (±Vc). As for another example for the execution of this invention, if the power source voltage (±Vc) of the differential amplifier (1) is ±12V, generally, the saturation output value of the above differential amplifier (1) is approximately ±10V. If an offset voltage around 0V is applied to the offset terminal of the above differential amplifier (1) simply to compensate the offset of the output voltage, as in the common use, as the amplification gain of the differential amplifier is 1, the output value correspond to the input signal of 10V~16V or higher among the input signal levels of the above differential amplifier (1) is saturated, and thus only the input signal within the range of 0 ~10V can be outputted. Therefore, it is impossible to measure the cell voltage of higher than 10V among the voltage 0~16V of the storage battery cell.

The above differential amplifier (1) is a differential Operational amplifier (for instance, CMOS type or FET type) whose impedance is very high (input bias electric current is nA and less) in comparison with ordinary differential Operational amplifier. Even if hundreds of KΩ resistance is connected to the non-inverting input and inverting input of the above differential amplifier, it can work accurately.

As shown in FIGS. 4 and 5, the high resistors about hundreds of KΩ are respectively connected to the non-inverting and inverting input terminals of the differential amplifier (1) so as to be applied the high common-mode voltage such as the post voltage of battery system or battery cells.

As it is designed so that the amplification gain for the differential input voltage signal can be 1, the output of the above differential amplifier (1) is the sum of the differential voltage signal ($V_+-V_-$) which is the storage battery cell post voltage and the reference voltage (Vref) which is inputted into the offset terminal, and is shown as ($V_+-V_-$) +Vref. Therefore, when the 0V~16V voltage signal of a battery cell post voltage ($V_{Is}$) is inputted, as the offset reference voltage (Vref) is set at −8V, the output of the above differential amplifier (1) can get values of −8V~+8V within the range of the saturation voltage of less than ±10V. Also, if the negative (−) reference voltage (Vref) which is inputted into the offset terminal be −11V, it is possible to input even the higher voltage within 1~21V into the above differential amplifier (1) by the above computing formula and also to get the output signal within −10V~+10V.

In the output voltage signal which is level-shifted to the size within −8V ~+8V through the above differential amplifier (1), the impedance voltage ($V_{Is'}$) with a number of mV peak value on the direct current voltage ($V_{Dc}$) components and the noise coming from outside are mixed. The ripple noise in the above output voltage signal ($V_{Is}$) is removed through the direct current filter circuit (3) comprised of Resistance R1 and Capacitor C1. And then the pure direct current voltage ($V_{Dc}$) signal comes out and is buffered (buffering −prevents the loading effect by the input-output impedance) in Buffer Circuit (4), and thus the buffered signal is connected to the input terminal of 12 Bits A/D converter (5) to raise the resolution degree for measurement. That is, because the allowable output range of the direct current voltage signal of the Buffer Circuit (4) is within −10V~+10V, it is possible to increase the resolution degree only by adopting a micro-controller unit (MCU) with a A/D converter which is able to convert the signal up to the above range of voltage or equivalent one.

In case of the capacity of a storage battery cell is less than several hundreds Ah, because the value of internal impedance becomes as high within tens mΩ, a A/D converter (5) of 10 Bit or less can be used to reduce the manufacturing cost, but the resolution decreases a little, and it is possible to use a A/D converter whose input range is of 0~5V built-in micro controller unit (MCU). A MCU sold in the market, in general, has the multiplexer installed in the front of it, and it has a circuit to convert several analog input signals to Digital signals by means of high-speed multiplex switching. Hence, the microcontroller unit (MCU) operates as if it has several A/D converters inside conceptually.

Further more, if the circuits consist of the A/D converter (5 or 9) circuitry built in the micro controller unit (MCU) as above, the output of the above buffer (4) has to be within 0V~5V, even when the storage battery cell post voltage ($V_{Is}$) is inputted as the signal of 1V~16V, it is possible to get the output of −6V~+9V in the above differential amplifier (1) by setting the offset reference voltage (Vref) of the above differential amplifier (1) to 7V for instance. FIG. 6 shows the divider/buffer circuit and adder, as an example of the execution of this invention. After the output voltage of −6V~+9V obtained from the above differential amplifier (1) is divided one-third in the divider/buffer circuit, the signal of −2V~+3V is obtained, and again by adding the voltage signal ($V_{f2}$) in the disclosed adder circuit, the level of the above signal of −2V~+3V is shifted to 0V ~+5V. As the output signal of the above adder circuit is 0V~+5V range, it is possible to adopt the A/D converter (the input range is of 0V~+5V) built-in the micro controller unit (MCU).

On the other hand, as above, the cell voltage signal ($V_{Is}$) which is converted to the level of −8V~+8V or of −6V~+9V does not include any direct current components as removed during passing through the Direct Current Coupling Circuit (6) comprised of Capacitor C2 and R2 and an impedance voltage which is a pure alternating signal is come out. And then it passes through the Band-Pass Filter (BNP) (7). The above band-pass filter attenuates and rejects the noise signals whose frequency bandwith is different from the impedance voltage signal ($V_{Is'}$). It is possible to enhance or raise the filtering effect as it is designed to surely remove the noise signal generated by the charging ripple current and the noise generated by the effect of induction by using a common narrow-band pass filter. The impedance voltage signal ($V_{Is'}$) which has passed through the band-pass filter (7) passes through a Operational amplifier group (8), thereafter. The above Operational amplifier group (8) is comprised of, for instance, Operational amplifiers (15, 17, 19) from one stage to three stages, to amplify the impedance signal ($V_{Is'}$) of wide range to the desired level. In other words, the signal is amplified by several tens of times to several thousands of times to the level signal within ±10V, and is converted to a digital signal of high resolution of 12 Bits by 12 Bit A/D converter (9,9a), and is measured and computed accurately in the micro-processor unit, CPU (10). When there is a need to measure the phase of the above impedance voltage signal ($V_{Is'}$) by means of the disclosed zero (0) cross circuit, it has to completely filter the above impedance voltage signal ($V_{Is'}$). For this purpose, a second BNP (11) can be installed on the back of the Operational amplifier group (8).

FIG. 8 shows an example of execution of the band-pass Filter (7) designed in a way that allows only the signal with the frequency range similar to the impedance voltage signal ($V_{Is'}$). The Band-Pass Filter (7), described as above, is comprised the disclosed identical structure narrow-band pass filters which are connected in a phase of two-stage dependently, and each of the above narrow-band pass filters is comprised of two condensers and three resistors and one Operational amplifier, as known. When connecting the narrow-band pass filters dependently in two stages like this, it is able to have a characteristics of the band pass filter which is much narrower than the wide band pass filters in which a low-band pass filter (LPF) and a high band pass filter (HPF) are connected dependently.

In order to simplify the above band pass filter (7) circuit, it is possible to set two of Condensers C1, C2, C3 and C4 to be equal or all to be the equal value, and then to choose Resistance value of R1~R6 properly. So as to make the print circuit board (PCB) compact, chip-type condensers can be used in general. As an example of the embodiment, to simplify the configuration of the circuit, the value of Condenser C1, C2, C3, and C4 was all set at 10 nF identically, then it is possible to set easily the bandwidth of the above Band-Pass Filter (7) relatively as the value that designer wants by choosing the value of Resistance R1~R6 properly to set the low-band blocking frequency ($f_L$) and the high-band blocking frequency ($f_H$).

FIG. 9 shows, as described above, the results of the simulation of the filtering characteristics of the band pass filter (7) by frequency bands which are obtained from the two-stages dependent connection of the identical configuration narrow-band pass filters by means of PSPICE. As seen in FIG. 9, for example, in case the resonance frequency (fr) is selected to be 720 Hz, the attenuation value of the frequency 660 Hz~780 Hz which is within ±5% of the resonance frequency (fr) can designed to become near-zero (has the maximum gain). In the above band pass filter (7), if the frequency of the impedance Voltage signal ($V_{Is}'$) is 720 Hz, the attenuation value of that signal is near-zero (has the maximum gain), and because the attenuation value of the frequency within ±5% of the resonance frequency (fr) is almost near-zero (has the maximum gain), the attenuation value of the impedance voltage signal ($V_{Is}'$) having passed the above band pass filter (7) is consistently maintained near-zero, even though the resonance frequency (fr) varies about within ±5% by changes of the ambient temperature.

Also because the resonance frequency (fr) is the same as 720 Hz and has much narrower bandwidth than that of the conventional wide-band pass filter (BPF) in which the low-band blocking frequency ($f_L$) and the high-band blocking frequency ($f_H$) are 400 Hz and 1000 Hz respectively, it is possible to improve the attenuation characteristic of noise frequencies and surely to remove the noise signal by charging current ripple and the noise generated due to induction. On the contrary, as the narrow-band pass filter circuit which is designed to have one Operational amplifier has very narrow bandwidth, it is possible to get the maximum gain only in the designated resonance frequency (fr). Therefore, it has a disadvantage that the attenuation characteristic of the desired signals in measuring the impedance voltage signal ($V_{Is}'$) varies and resultantly comes to decrease depending on the ambient temperatures and because the values of a resistor and a condenser which are the circuitry elements of the filter circuit vary when the ambient temperatures change.

As stated above and shown by FIG. 3 and FIG. 4, the gist of this invention is presented as the direct current voltage ($V_{dc}$) signal is inputted into the A/D converter (5) and the impedance voltage signal ($V_{Is}'$) is inputted into another A/D converter (9) based on the conceptional theory. However, because in reality the devices sold in the market in general have a number of channel multiplexers (MUX) with an analog switching function on the front of the A/D converter. The direct current voltage ($V_{dc}$) signal and the impedance voltage signal ($V_{Is}'$) are connected to the A/D converter circuit by means of the above multiplexer (MUX) and converted from analog to digital at the point of time for computation, and then the computing is done in the CPU (10).

Also as described above, it is possible to convert the impedance voltage signal ($V_{Is}'$) from analog to digital by using the A/D converter whose input range is 0V~+5V which is built in the element of the above micro controller unit (MCU) in a way similar to converting the direct current voltage (Vdc) signal from analog to digital by using the A/D converter built in the micro controller unit (MCU). As described above, the input range of the A/D converter built in the element of the micro controller unit (MCU), in most cases, is 0 V~+5 V. The impedance voltage signal ($V_{Is}'$) with a number of mV is filtered through the above band pass filter (7), and then is amplified tens of times in the first amplifier (15) or passing through the second amplifier (17) to be amplified hundreds of times to thousands of times, and then it becomes a signal of −2.5V~+2.5V. FIG. 7 shows the block diagram which is an example of embodiment of the amplifier group (8) circuit which is behind the circuit of the band pass filter (7) as described above. The first Adder (16) or the second Adder (18) has the identical structure to the Adder in FIG. 6 which is described above, and is connected to the back terminals of the first amplifier (15) and the second amplifier (17) respectively. The impedance voltage signal ($V_{Is}'$) is shifted to a signal of 0V~+5V through the first or the second Adder above and inputted into the A/D converter (9,9a). As described above, the Operational amplifier group (8) circuit has a two-stages amplifier group, but in case that the measuring range is large, it is possible to use an amplifier group comprised of a number of stage amplifiers (15, 17, 19).

The constant current signal (Is) which is necessary for impedance computation is amplified up to a proper level through the amplifier (12) and is connected to another input terminal of the above multiplexer (MUX) circuit. The temperature signal made in the disclosed thermistor sensor is amplified up to a proper level through the disclosed Wheaston bridge circuit (13) and another amplifier (14), and sequentially connected to another input terminal of the above multiplexer (MUX) and then computed and measured in the CPU (10).

MODE FOR INVENTION

FIG. 5 shows an example of execution of this invention by using the device sold in the market. The commercialized A/D converter circuitry include A/D converters which can convert the level signals of ±10V to digital signals, and the said A/D converters have built-in high speed multiplexer (MUX) circuit. The said multiplexer (MUX) circuit plays the role of receiving the select signals from the CPU (10) and connecting the analog signals of a number of channels to the A/D converter (ADC) at a high speed sequentially at the point of time when computation is needed. The said analog input signals are converted to digital signals at a high speed by the said A/D converter (ADC), and applied to the input terminal of the CPU (10) and computed. As in the prototype circuit of this invention, the AD7891 A/D converter (ADC), a model of the Analog Device is used and it is possible to convert the analog signal of ±10V to a digital signal of 12 Bits at a high speed conversion time of 1.6 micro seconds so as to raise the resolution degree at the time of computation. As a result, it raises the degree of accuracy in measurement.

The invention claimed is:
1. A circuit for measuring post voltage and internal impedance value of storage battery cells, the circuit comprising:
 a differential amplifier having inputs connected to battery terminals (+, −);
 a reference constant voltage circuit connected to offset terminals of the differential amplifier;

a direct current coupling circuit connected to an output of the differential amplifier;

a band pass filter configured to allow only signals having a frequency band near to internal impedance voltage signals to be passed;

a A/D converter for converting analog signals into digital signals, wherein the analog signals include alternating current signals flowing into the battery cells, internal impedance voltage signals obtained from an output of the direct current coupling circuit, and direct current voltage of the battery cells obtained from the output of the differential amplifier; and a central processing unit (CPU) configured to compute internal impedance values by obtaining output signals of the A/D converter.

2. The circuit as claimed in claim 1, wherein the A/D converter includes multiplexer (MUX) circuits having a plurality of input channels.

3. The circuit as claimed in claim 2, wherein the A/D converter and the CPU comprise a micro controller unit (MCU).

4. The circuit as claimed in claim 1, wherein the band pass filter includes a narrow-band pass filter, dependently connected in two steps, in which input signals are connected to an inverting input terminal of an operational amplifier through a first resistor and a first condenser, and a second condenser is connected between a common connecting point of the resistor and the first condenser, and an output terminal of the operational amplifier.

5. A circuit for measuring post voltage and internal impedance voltage storage battery cells, wherein:
(i) storage batter cell terminal voltages are connected to non-inverting and inverting input terminals of a high input common mode voltage differential amplifier, negative constant voltages generated by a reference constant voltage circuit are connected to an offset terminal of the differential amplifier, an output of the differential amplifier is converted to A/D values through a DC filter circuit for eliminating noise, and
(ii) an output of the differential amplifier is convened into impedance voltage signals after passing a direct current coupling circuit, and then the impedance voltage signals is converted into A/D values after passing through a band pass filter.

6. The circuit as claimed in any one of claims 1-3 and 5, wherein the reference constant voltage has two constant voltage diodes, a current limiting resistor in a serial connection, and an offset reference voltage at an offset terminal of the differential amplifier, the offset reference voltage being configured to be slightly varied by a variable resistor connected to the constant voltage diodes.

7. The circuit as claimed in claim 5, wherein the high input common mode voltage differential amplifier comprises a very high input impedance, wherein hundreds of kilo ohm (KΩ) resistors are connected to the inverting and non-inverting input circuits of the differential amplifier and; the reference constant voltage circuit is connected to the offset terminal of the differential amplifier.

8. A circuit for measuring post voltage and internal impedance value in storage battery cells, wherein:
(i) analog signals are connected to multiplexer circuit input channels of an analog to digital converter circuit (ADC),
(ii) said analog signals are input to ADC circuit by channel select signals from a CPU output, and
(iii) and said analog signals comprise:
direct current voltage signals of storage battery cells received as an output of a high input common mode voltage differential amplifier;
internal impedance voltage signals obtained from a direct current coupling circuit connected to the output of the high input common mode voltage differential amplifier; and
alternating current signals flowing into the storage battery cells.

9. The circuit as claimed in claim 1, wherein the A/D converter is equivalent to an AD7891 able to convert analog signals of about ± 10V into 12 bit digital signals.

10. The circuit as claimed in claim 1, wherein the differential amplifier comprises a differential operational amplifier element having a very high input impedance comprising resistors having resistance values in hundreds of kilo ohm (KΩ), respectively connected to inverting and non-inverting input circuits of the differential amplifier, and an offset terminal applied with negative constant voltage.

* * * * *